(12) United States Patent
Fujimori

(10) Patent No.: US 6,833,574 B2
(45) Date of Patent: Dec. 21, 2004

(54) SEMICONDUCTOR DEVICE HAVING FERROELECTRIC SUBSTANCE CAPACITOR

(75) Inventor: Yoshikazu Fujimori, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/216,109

(22) Filed: Aug. 9, 2002

(65) Prior Publication Data
US 2003/0107072 A1 Jun. 12, 2003

(30) Foreign Application Priority Data
Aug. 10, 2001 (JP) ........................................ 2001-244102

(51) Int. Cl.$^7$ .............................................. H01L 31/119
(52) U.S. Cl. ........................ 257/296; 257/301; 257/302; 257/330
(58) Field of Search ................................ 257/332, 333, 257/335, 336, 758, 301, 774, 326, 296, 295, 303, 246; 365/182

(56) References Cited

U.S. PATENT DOCUMENTS

| | | | | |
|---|---|---|---|---|
| 6,284,586 B1 | * | 9/2001 | Seliskar et al. | 438/239 |
| 2002/0043676 A1 | * | 4/2002 | Ohtsuka et al. | 257/295 |
| 2003/0006443 A1 | * | 1/2003 | Yang et al. | 257/296 |
| 2003/0030088 A1 | * | 2/2003 | Kumagai et al. | 257/296 |

* cited by examiner

*Primary Examiner*—Long Pham
*Assistant Examiner*—Nathan W. Ha
(74) *Attorney, Agent, or Firm*—Merchant & Gould P.C.

(57) ABSTRACT

The invention provides a semiconductor device having a ferroelectric substance capacitor small in the occupying area and large in capacitance and a semiconductor device having a ferroelectric substance capacitor reducing influence of noise and being few in malfunctions. The semiconductor device includes a first capacitor formed on a surface of a semiconductor substrate and a second capacitor of a ferroelectric substance capacitance laminated on the first capacitor so as to connect in series.

5 Claims, 6 Drawing Sheets

SEMICONDUCTOR DEVICE HAVING FERROELECTRIC SUBSTANCE CAPACITOR

BACKGROUND OF THE INVENTION

The present invention relates to a semiconductor device having a ferroelectric substance capacitor, particularly to a structure for high integration.

As high integration and michronization of semiconductor device advance, an occupying area of each part is decreased largely in LSI, and research or providing as semiconductor mall and high in reliability is repeated.

In the semiconductor device having the ferroelectric substance capacitor being researched now, a capacitor using an ordinary insulating layer for dielectric substance layer such as a capacitor, called PIP capacitor, having an insulating layer between polysilicon layers, or a capacitor, called MOS capacitor, formed sandwiching a silicon oxide film between a silicon layer and metal is used greatly at the same time in order to detect reverse charge quantity of the ferroelectric substance capacitor and to convert to voltage.

That is, a ferroelectric substance capacitor $C_{FERO}$ and PIP capacitor $C_{PIP}$ are used greatly in series connection as shown in the equivalent circuit of FIG. 7.

Conventionally, in order to realize such the semiconductor device, as shown in FIGS. 8A and 8B, a first capacitor is formed on an element separating insulating film 2 formed on surface of a silicon substrate 1 and a second capacitor of a ferroelectric substance capacitor is formed so as to line with the first capacitor on the upper layer of the element region surrounded by the element separating insulating film 2. The first capacitor and the second capacitor are connected in series through a wiring pattern connected mutually through contact holes.

Here, the first capacitor is constructed by a first electrode 3 of a polysilicon layer formed on the element separating insulating film 2, a first insulating film 4 formed as two layers of a silicon oxide layer and a silicon nitride layer on the upper layer thereof, and a second electrode 5 of a polysilicon layer formed further the upper layer thereof.

The second capacitor is formed on the upper layer of the element region surrounded by the element separating insulating film as a not-common capacity, and the second capacitor includes a first electrode 7, a ferroelectric substance film 8, and a second electrode 9.

The mutual connection of the first and second capacitors is achieved through a wiring pattern 10 connected through contact holes.

Such the capacitor structure has large occupying area and it has been a large problem preventing michronization in LSI.

Further, there has been a problem that an escape route of noise is few so as to receive easily influence of noise as a device as shown in a explanation view of FIG. 9.

Thus, the conventional semiconductor device including the ferroelectric substance capacitor has large occupying area and it has been a large problem to prevent high integration of the device.

Further, the device easily receives influence of noise and it causes malfunction.

SUMMARY OF THE INVENTION

The invention is performed in view of the circumstances, and an object of the invention is to provide a semiconductor device having a ferroelectric substance capacitor small in the occupying area and large in capacitance.

An another object of the invention is to provide a semiconductor device having a ferroelectric substance capacitor reducing influence of noise and being few in malfunctions.

The invention is characterized by including a first capacitor formed on surface of a semiconductor substrate and a second capacitor of a ferroelectric substance capacitance laminated on the first capacitor so as to connect in series.

According to such the construction, it is possible to reduce occupying area without reducing capacitance because the first capacitor and the second capacitor of the ferroelectric substance capacitor are stacked. Since long wiring is reduced in the semiconductor device, propagation of noise is reduced and it is possible to reduce malfunction.

Preferably, the invention is characterized by that the first capacitor is formed on an element separating insulating film.

According to such the construction, it is possible to use efficiently on the element separating insulating film because the first and second capacitors are formed on the element separating insulating film. Since the capacitors are formed on the thick element separating insulating film, it is possible to provide high LSI in reliability at michronization without the element region in the substrate does not receive bad reflection even at possible diffusion such as Pb or $O_2$ from the ferroelectric substance thin film.

Preferably, the invention is characterized by that the upper electrode of the first capacitor and the lower electrode of the second capacitor are connected through plugs formed at an interlayer insulating film.

According to such the construction, the capacitor is high in reliability because the capacitor of laminating structure is formed using well a process for forming another element region.

Since the ferroelectric substance thin film or the ferroelectric substance capacitor and the electrode of the first capacitor are connected through plugs without contacting directly, diffusion such as Pb or $O_2$ from the ferroelectric substance thin film is cut off well only forming a barrier layer on the plug.

Preferably, the invention is characterized by connecting the upper electrode of the first capacitor and the lower electrode of the second capacitor are connected through a wiring layer formed on the upper layer or the second capacitor.

According to such the construction too, it is possible to obtain a laminating layer capacitor including good series connecting body.

Preferably, the invention is characterized in that the upper electrode of the first capacitor and the lower electrode of the second capacitor have a common electrode, and that a capacitor insulating film for the first capacitor is arranged at the lower layer side of the common electrode and the ferroelectric substance film is arranged at upper layer side.

According to Such the construction, since the upper electrode of the first capacitor and the lower electrode of the second capacitor have a common electrode, forming of the electrode layer and the interlayer insulating film is needless, and it is possible to provide a semiconductor device very simple and a little in difference of surface level.

In the case using such the structure, although diffusion such as Pb or $O_2$ from the ferroelectric substance thin film becomes a problem, by using high material in oxygen shielding effect such as two layers structure film of iridium and iridium oxide as the common electrode, diffusion such as Pb or $O_2$ from the ferroelectric substance thin film is depressed well, and it is possible to provide high device in reliability.

By adopting such the construction, floating capacitance removes and it is possible to design high driving speed.

Preferably, the invention is characterized in that the lower electrode of the second capacitor includes the laminating film of iridium and iridium oxide.

According to such the construction, diffusion such as Pb or $O_2$ from the ferroelectric substance thin film is depressed well, and it is possible to provide high device in reliability.

DETAILED DESCRIPTION OF THE PREFERRED EMBODIMENT (Embodiment 1)

A semiconductor device having a PIP capacitor and a ferroelectric substance capacitor will be described for a first embodiment of the invention. The semiconductor device includes a first capacitor $C_{PIP}$ of a PIP capacitor formed on a surface of a semiconductor substrate and a second capacitor $C_{FERO}$ Of a ferroelectric substance capacitor laminated on the first capacitor $C_{PIP}$ so as to connect thereto in series as shown in FIG. 1A, a plane view, and 1B a sectional view cut by A—A line.

Figure 1A:
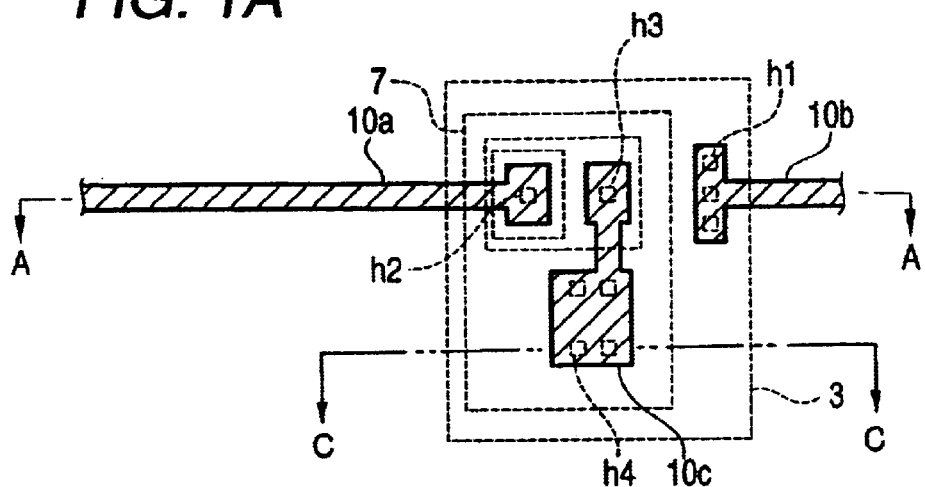
FIGS. 1A and 1B are views showing a semiconductor device of a first embodiment of the invention.
Figure 1B:
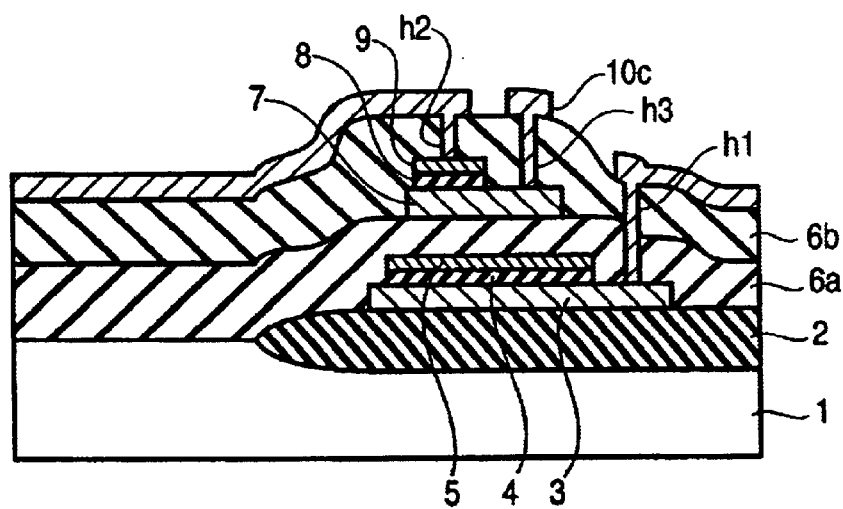

That is, as shown in FIGS. 1A and 1B, the second capacitor $C_{FERO}$ of the ferroelectric substance capacitor is laminated on an element separating insulating film 2 formed on surface of a silicon substrate 1. The first capacitor and the second capacitor are connected in series through wiring pattern mutually connected through contact holes h3 to h4.

Here, the first capacitor is constructed by a first electrode 3 of a polysilicon layer formed on an element separating insulating film 2, a first insulating film 4 formed on the first electrode 3 as two layers or a silicon oxide layer and a silicon nitride layer, and a second electrode 5 of a polysilicon layer further formed on the first insulating film 4.

The second capacitor is constructed by a first electrode 7 of two-layer film of iridium oxide and iridium formed through a first interlayer insulating film 6a covering the second electrode 5 of the first capacitor $C_{PIP}$, a ferroelectric substance film 8 of PZT film formed on the first electrode thereof, and a second electrode 9 of two-layer film of iridium and iridium oxide formed on the ferroelectric substance film 8.

Further, the upper layer thereof is covered with a second interlayer insulating film 6b, mutual connection and taking out of the electrode are performed at wiring patterns 10a to 10c formed on the second interlayer insulating film 6b.

Here, the lower layer side electrode of the first capacitor, that is, the first electrode 3 is connected to the wiring pattern 10b through a first contact hole h1 formed through the first and the second interlayer insulating films 6a and 6b, and is taken out to outside so as to connect a ground wire.

The upper layer side electrode of the first capacitor, that is, the second electrode 5 is connected to the wiring pattern 10c through a contact hole h4 formed through the first and the second interlayer insulating films 6a and 6b, and is formed so as to contact the lower layer side electrode of the second capacitor, that is, the first electrode 7, through the third contact hole h3.

Further, the upper layer side electrode of the second capacitor, that is, the second electrode is connected to the first wiring pattern 10a through the second contact hole h2 so as to connect to signal wire side.

Figure 2:
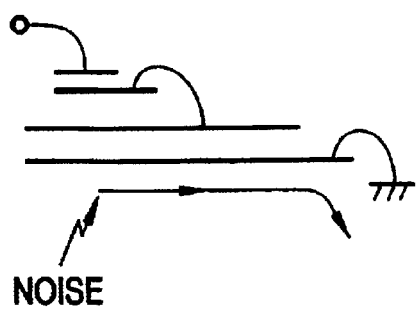
FIG. 2 is a describing view showing propagation of noise of the semiconductor device.

According to such the construction, noise picked up by the first electrode of the first capacitor flows through the ground line efficiently as it is, so it is possible that the capacitor hardly receives influence of the noise because the second electrode of the first capacitor and the first electrode of the second capacitor have the same electric potential as shown in the describing view of FIG. 2.

Next, a process for manufacturing the ferroelectric substance capacitor will be described with reference to FIGS. 3A to 3E.

Figure 3A:
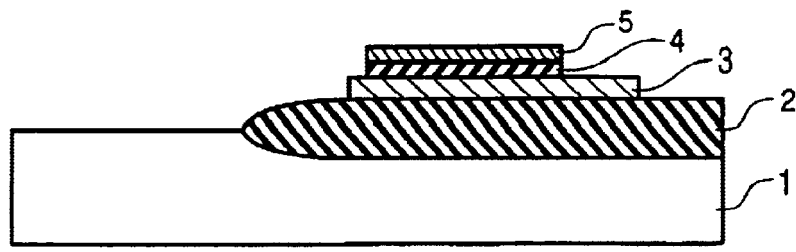
FIGS. 3A to 3E are views showing a process for manufacturing the semiconductor device of a first embodiment of the invention.
Figure 3B:
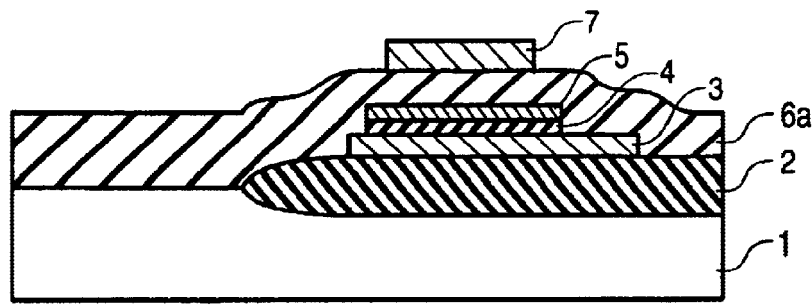

First, the element separating insulating film 2 is formed on surface of the silicon substrate 1 by LOCOS method, a desired element region is formed in the element forming region surrounded with the element,separating insulating film 2, and a polycrystal silicon film 3 is formed on the element separating insulating film 2 by CVD method. On the surface thereof, a capacitor insulating film 4 or a laminating body of silicon oxide film and silicon nitride film is formed by thermal oxidation and CVD method, then, a polycrystal silicon film 5 is formed by CVD method. After that, patterning is performed by photography method so as to form the first capacitor (FIG. 3A).

Continuously, a PSG film is formed for the first interlayer insulating film 6a.

After that, laminating film of iridium oxide and iridium is formed targeting iridium by spattering method, and a first electrode 7 is formed by patterning the laminating film.

Figure 3C:
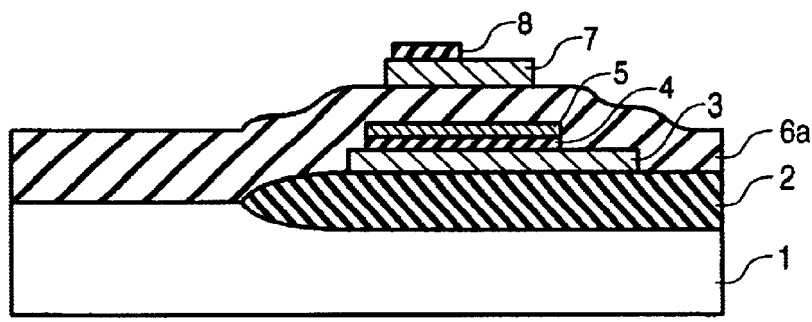

After that, a PZT film is formed on the first electrode 7 for a ferroelectric substance film 8 by sol-gel method as shown in FIG. 3C. Mixed solution of $Pb(CH_3COO)_2 \cdot 3H_2O$, $Zr(t-OC_4H_9)_4$, and $Ti(i-OC_3H_7)_4$ is used as a starting material. After spin coating the mixed solution, the film is dried at 150° C., and temporary baking of 400° C., 30 minutes is performed at dry air atmosphere. After repeating this five times, thermal treatment of more than 700° C. is performed. Thus, the ferroelectric substance film 8 of 250 nm is formed. Here, the PZT film is formed placing 0.52 for x (PZT (52/48) hereafter) in $PbZr_xTi_{1-x}O_3$.

Figure 3D:
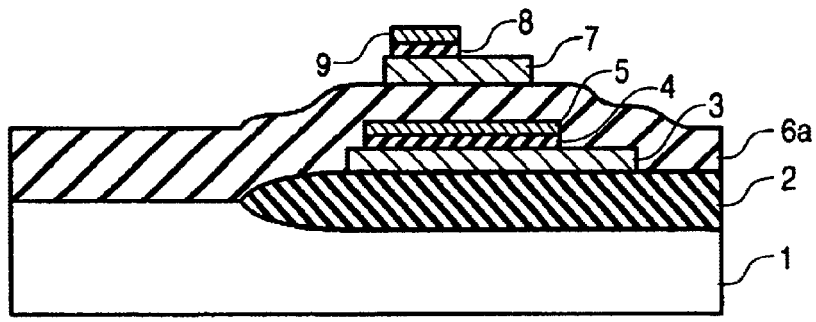

Further, a laminating layer film of iridium oxide layer and iridium layer is formed on the ferroelectric substance film 8 by spattering method (FIG. 3D). This laminating layer film of the iridium oxide layer and the iridium layer is formed to be the second electrode 9. Here, the second electrode 9 including the iridium oxide layer and the iridium layer is formed to have 200 nm thickness. Accordingly, the structure having ferroelectric substance capacitor as the second capacitor laminated on the first capacitor is obtained.

Figure 3E:
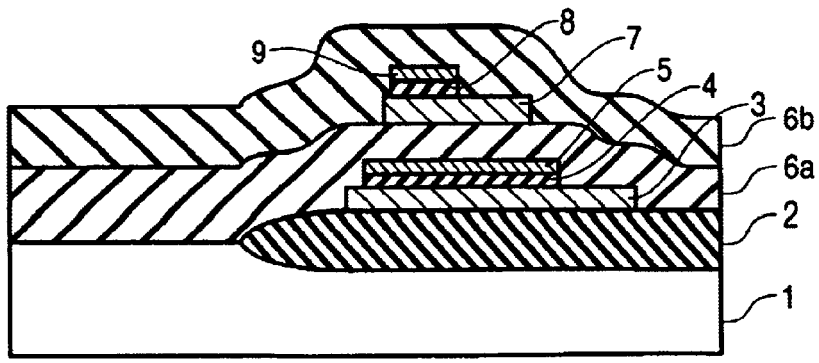

A BPSG film is formed as the second interlayer insulating film 6b, and the contact holes h1 to h4 are formed by photolithography as shown in FIG. 3E.

Figure 1C:
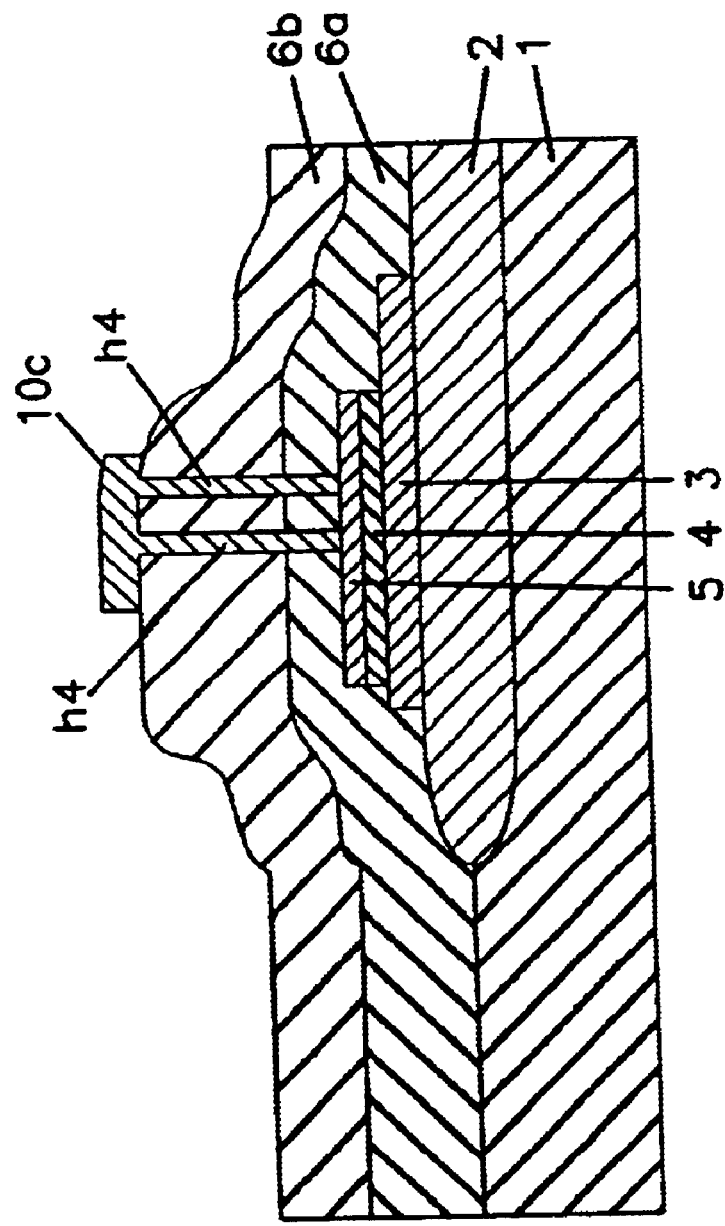

W (tungsten) is filled in the contact holes by CVD method, Al (aluminum) layer is formed on surface of the substrate for wiring pattern, and first to third wiring patterns 10a to 10c are formed pattering by photolithography so as to complete the semiconductor device of the first embodiment of the invention shown in FIG. 1.

According to such the construction, the first and the second capacitors are formed on the element separating insulating film 2, the upper part of the element separating insulating film is used efficiently for the capacitor and it is possible to design large reduction of occupying area. Since the capacitor is formed on the thick element separating film, the element region in the substrate does not receive bad influence so as to provide a high LSI in reliability at michronization even if there is diffusion of Pb or $O_2$ from the ferroelectric substance thin film.

Since the ferroelectric substance thin film of the ferroelectric substance capacitor and the electrode of the first capacitor are connected through plugs without contacting directly, diffusion of Pb or $O_2$ from the ferroelectric substance thin film is cut off well only by forming a barrier layer at the plug so that there is not possibly deterioration caused by diffusion.

The LSI is possible to form very easily at manufacturing.

Since propagation of noise is reduced, it is possible to provide a semiconductor device a few in malfunctions.

When there is possibly diffusion of composing element of the ferroelectric substance film, a barrier layer such as titanium, titanium oxide, or titanium nitride lay be placed between the polycrystal silicon layer constructing the plug and the first or the second electrode of the second capacitor. Thus, it is possible to obtain a semiconductor device good in working performance and high in reliability.

Further, the titanium layer has action as a junction layer. Adhesion of iridium and silicon, or silicon oxide is not so good. Because of that, the layer comes off partly and there is possibly deterioration of ferroelectric characteristics. However, in the embodiment, titanium oxide layer acts as junction layer. Thus, not only there is diffusion preventing effect to the silicon oxide of Pb or Zr, but also it is possible to improve ferroelectric characteristics even by improvement of adhesion.

(Embodiment 2)

Figure 4A:
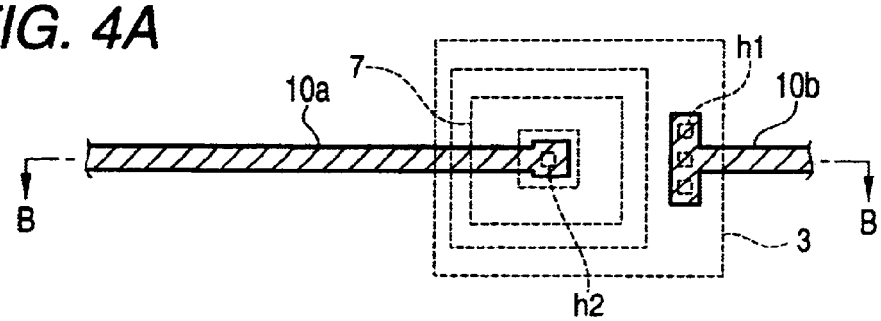
FIGS. 4A and 4B are views showing the semiconductor device of the second embodiment of the invention.
Figure 4B:
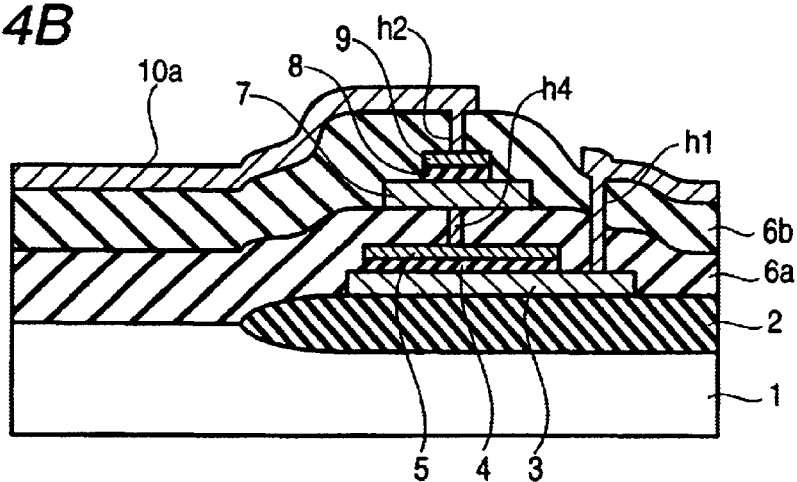

Next, a second embodiment of the invention will be described with reference to FIGS. 4A and 4B, FIG. 4A is a plane view showing the semiconductor device of the second embodiment of the invention, and FIG. 4B is a sectional view cut by B—B line.

Although connection of the first capacitor and the second capacitor is performed by the wiring pattern of surface of the substrate through the contact hole formed at each electrode of each capacitor in the first embodiment, in the embodiment, the second electrode 5 positioning at the upper layer side of the first capacitor by plugs constructed by the fourth contact hole h4 formed at the first interlayer insulating film 6a formed on the upper layer of the first capacitor and the first electrode 7 of the second capacitor just on the second electrode 5 are connected after forming the first capacitor. Therefore, since electrodes are connected in the capacitor region, it is possible to design reduction of occupying area comparing the first embodiment.

Another construction is formed similarly as the first embodiment.

Forming the fourth contact hole and the plugs do not cause increase of process by performing the same process as forming plugs such as tungsten plug at element region, and it is possible to realize michronization of occupying area.

(Embodiment 3)

Figure 5A:
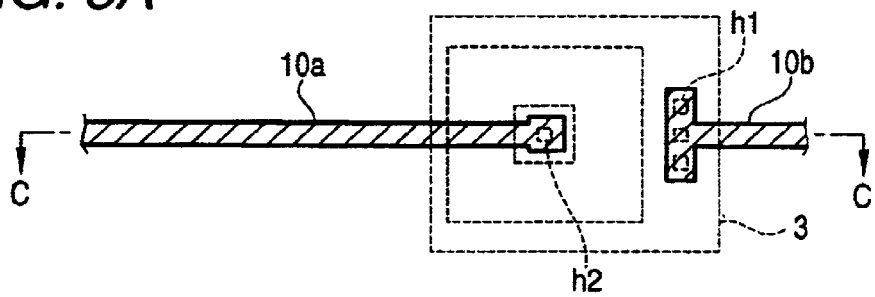
FIGS. 5A and 5B are views showing the semiconductor device of the third embodiment of the invention.
Figure 5B:
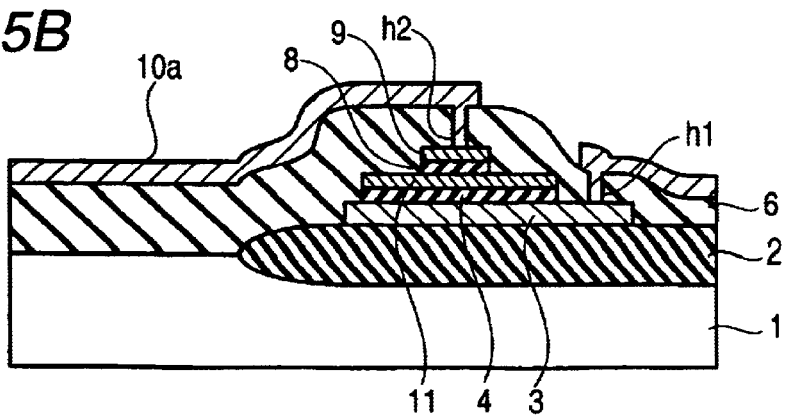

Next, a third embodiment of the invention will be described with reference to FIGS. 5A and 5B. FIG. 5A is a plane view showing the semiconductor device of the third embodiment or the invention, and FIG. 5B is a sectional view cut by C—C line.

Although connection of the first capacitor and the second capacitor is performed through the contact hole formed at each electrode of each capacitor in the first embodiment, in the embodiment, the upper portion electrode of the first capacitor and the lower portion electrode of the second capacitor are constructed by a common electrode 11 of two-layer film of iridium and iridium oxide film. It is characterized that the capacitor insulating film 4 for the first capacitor is arranged at lower layer side of the common electrode 11 and the ferroelectric substance film 8 of PZT is arranged on the common electrode 11.

According to such the construction, since the upper portion electrode of the first capacitor and the lower part electrode of the second capacitor are used for the common electrode, forming the electrode layer and the interlayer insulating film is needless, so it is possible to provide a semiconductor device very simple and a little difference of surface level.

Although diffusion of Pb and $O_2$ from the ferroelectric substance thin film 8 becomes problem in the case using such the structure, by using high material in oxygen shielding effect such as two-layer structure film of iridium and iridium oxide as a common electrode, diffusion of Ph and $O_2$ from the ferroelectric substance thin film layer is depressed well, and it is possible to provide a high device in reliability.

(Embodiment 4)

Next, a fourth embodiment of the invention will be described.

Although the embodiment constructed PIP capacitor for the first capacitor in the first to the third embodiments, it is applicable in the case using the MOS capacitor.

Figure 6:
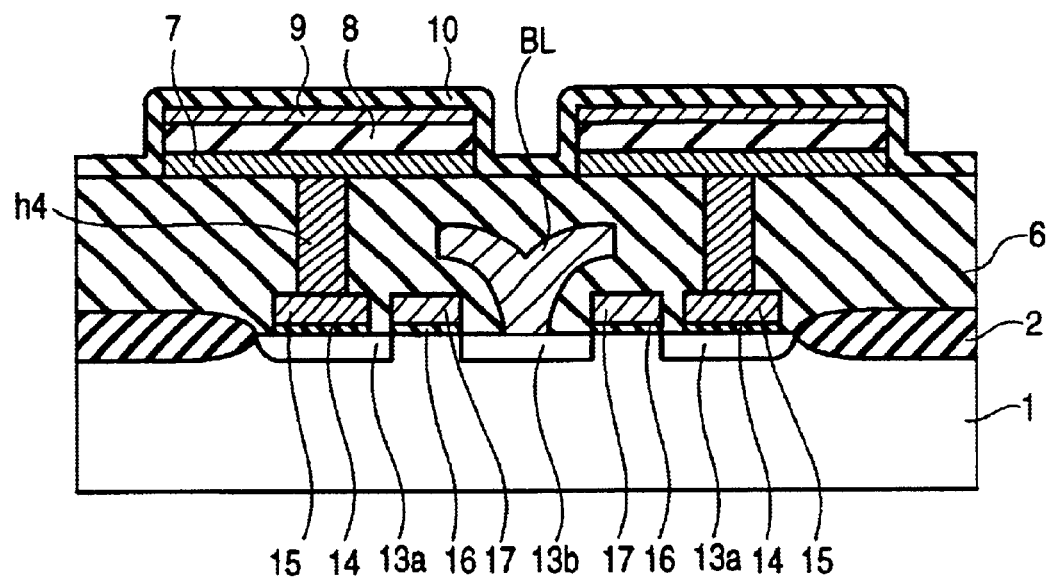
FIG. 6 is a describing view of the principle describing a method of the fourth embodiment of the invention.
Figure 7:
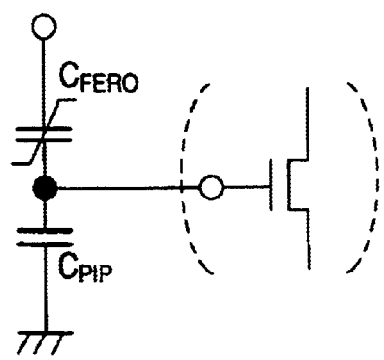
FIG. 7 is a view showing an equivalent circuit of the invention.
Figure 8:
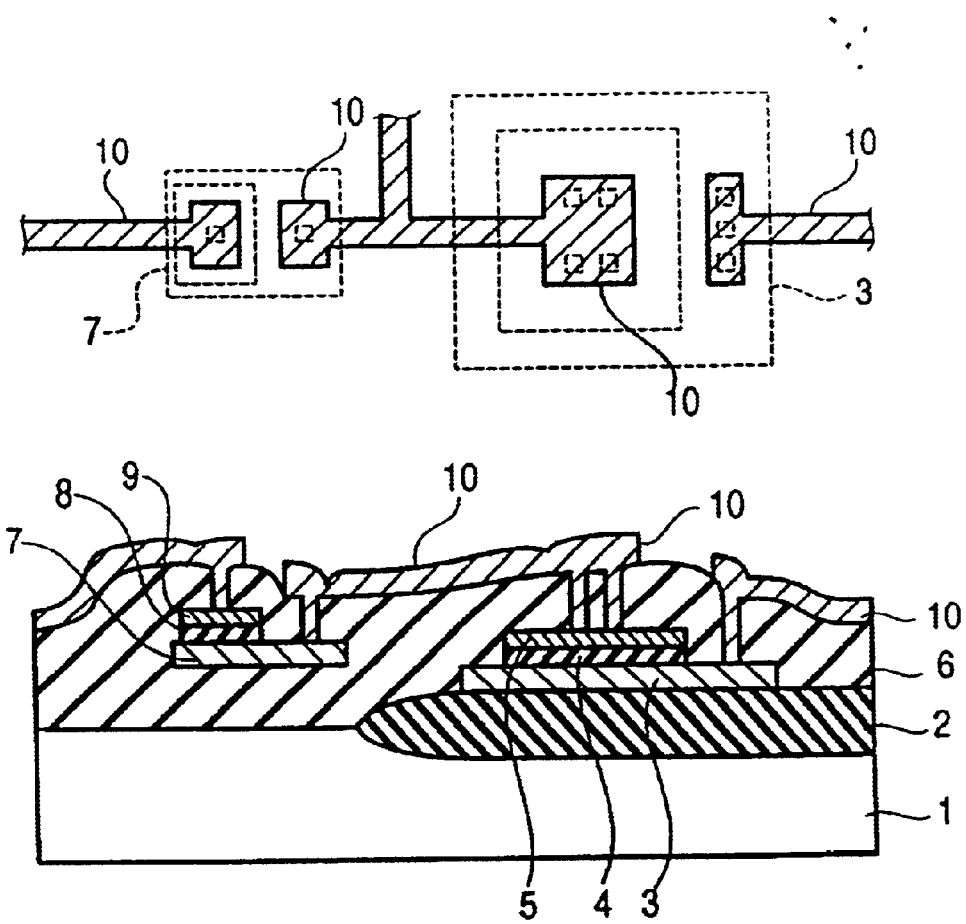
FIGS. 8A and 8B are views showing the conventional semiconductor device.
Figure 9:
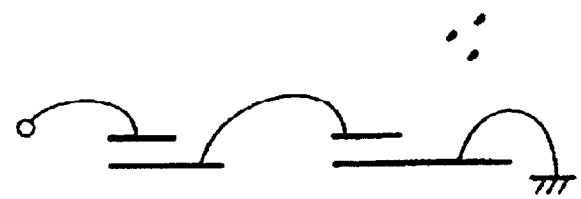
FIG. 9 is a describing view showing propagation of noise of the conventional semiconductor device.

FIG. 6 is a view constructing the first capacitor with MOS capacitor.

A MOSFET as a switching transistor is formed at element region surrounded by the element separating insulating film 2 formed on surface of the silicon substrate. Second electrodes 15 of polycrystal silicon film is formed at one of source drain regions 13a and 13b of the MOSFET through a silicon oxide film 14 so as to form the MOS capacitor. At the upper layer thereof, a second capacitor is formed through a through hole h4.

The second capacity constructed by a first electrode 7 or two-layer film of iridium and iridium oxide, a ferroelectric substance film 8 of PZT, and second electrodes 9 of iridium and iridium oxide similarly as the first to the third embodiments.

Here, the MOSFET is constructed by the above source-drain regions 13a and 13b and a gate electrode of polycrystal silicon formed between the regions through the gate insulating film 16.

The MOSFET is formed similarly as the ordinal MOS process at manufacturing.

The first capacitor may be formed so as to extend on the element separating insulating film.

The connection of the first and the second capacitors is changeable similarly as the first to third embodiments. When the upper layer side electrode of the first capacitor and the lower layer side electrode of the second capacitor are used as a common electrode like the structure of the third embodiment shown in FIGS. 5A and 5E, it is desirable to place a barrier layer to prevent diffusion of Pb or $O_2$ included in the ferroelectric substance film and desirable to use two-layer film of iridium and iridium oxide for the electrode.

Although the first and the second electrodes of the second capacitor are constructed by the laminating layer film of iridium and iridium oxide in the embodiment, they may be two-layer film of platinum and iridium. In the case using plugs, there is a case that the film may be a single layer film.

Without limiting to titanium, the material withstanding following high temperature process is selectable suitably for the barrier layer or the adhesive layer. The followings too are applicable: titanium, tantalum, zirconium, tungsten, these nitride, and nitride of high melting point metal containing aluminum or silicon such as TaAlN and TaSiN. For example, since TaAlN adding aluminum to TaN has characteristic being easy In etching and good in working performance, it is useful material in the case needing patterning. Since TaSiN adding silicon to TaN contains silicon, there are characteristics that preventing effect of diffusion of silicon from silicon oxide layer is high, etching is easy comparing with TaN, and working performance is good. Therefore, it is useful material in the case needing patterning. Further, the TaSiN becomes microcrystal or amorphous by adding Si so that barrier performance improves.

Although PZT is used for the ferroelectric substance film 8 in each embodiment, ferroelectric substance such as SBT or high permittivity dielectric such as BST is applicable.

Material characteristic of iridium is almost equal to the same of platinum. Resistivity of iridium is less than platinum and is desirable material for electrode. Resistivity of iridium oxide is $49 \times 10^{-6}$ $\Omega$cm, so there is no problem as material of the electrode.

Although iridium permeates through oxygen in the ferroelectric substance film 5 because of crystallization of column shape, two-layer film of iridium and iridium oxide or two-way film covering the upper layer of iridium with Pt is used in the embodiment. Since the iridium oxide hardly permeates through oxygen because of not having crystal structure, of column shape, shortage of oxygen of the ferroelectric substance film can be prevented. For preventing oxidation of iridium, it is desirable to form a platinum layer on the surface, however it may not be formed. Although there is high possibility that whole of the electrode become iridium oxide layer at oxidation of iridium, the iridium oxide layer is conductive and has a fine film structure to prevent permeation of oxygen and like so as to act well as an oxidation preventing film.

As described above, since the first capacitor and the second capacitor of the ferroelectric substance capacitor are laminated, reduction of occupying area can be designed without reducing capacity. Since drawing of long wiring is reduced in the semiconductor device, propagation of noise can be reduced and it is possible to design reduction of malfunction.

What is claimed is:

1. A semiconductor device comprising:

a first capacitor formed on a surface of a semiconductor substrate; and a second capacitor of the ferroelectric substance capacitance laminated on the first capacitor to be serially connected with the first capacitor, wherein an upper electrode of the first capacitor and a lower electrode of the second capacitor are connected through a wiring layer formed above the second capacitor, and a lower electrode of the first capacitor and the lower electrode of the second capacitor overlap vertically.

2. The semiconductor device as claimed in claim 1, wherein the first capacitor is formed on an element separating insulating film.

3. The semiconductor device as claimed in claim 1, wherein a lower electrode of the second capacitor includes the laminating film of iridium and iridium oxide.

4. A semiconductor device comprising:

a first capacitor formed on a surface of a semiconductor substrate; and a second capacitor of the ferroelectric substance capacitance laminated on the first capacitor to be serially connected with the first capacitor;

a common electrode, the common electrode forming an upper electrode of the first capacitor and a lower electrode of the second capacitor;

a capacitor insulating film of the first capacitor provided below the common electrode; and a ferroelectric substance film of the second capacitor provided on the common electrode, wherein a lower electrode of the first capacitor and the lower electrode of the second capacitor overlap vertically.

5. The semiconductor device as claimed in claim 4, wherein the first capacitor is formed on an element separating insulating film.

* * * * *